United States Patent [19]
Yoshizawa et al.

[11] Patent Number: 4,800,565
[45] Date of Patent: Jan. 24, 1989

[54] SEMICONDUCTOR LASER DEVICE HAVING HIGH OPTICAL INTENSITY AND RELIABILITY

[75] Inventors: Misuzu Yoshizawa, Tokyo; Kazuhisa Uomi, Hachioji; Toshihiro Kawano, Ome; Yuichi Ono; Takashi Kajimura, both of Tokyo, all of Japan

[73] Assignee: Hitachi, Ltd., Tokyo, Japan

[21] Appl. No.: 94,602

[22] Filed: Sep. 9, 1987

[30] Foreign Application Priority Data

Sep. 16, 1986 [JP] Japan .................. 61-215717

[51] Int. Cl.⁴ ............................................. H01S 3/19
[52] U.S. Cl. ........................................ 372/45; 372/46
[58] Field of Search ............... 372/44, 45, 46; 357/17

[56] References Cited

FOREIGN PATENT DOCUMENTS 0171188 9/1984 Japan.
0042984 3/1986 Japan.

Primary Examiner—James W. Davie
Attorney, Agent, or Firm—Antonelli, Terry & Wands

[57] ABSTRACT

Disclosed is a semiconductor laser wherein an interface layer is provided on an upper cladding layer formed on an active layer, the interface layer having a smaller Al mole ratio than that of the upper cladding layer, thereby preventing oxidation of the semiconductor surface which is exposed to the atmosphere, and thus improving the crystallizability of a semiconductor layer which is to be formed subsequently. By setting the refractive index of this semiconductor layer so as to be smaller than that of the upper cladding layer, light can be confined in the active layer at increased efficiency.

9 Claims, 3 Drawing Sheets

SEMICONDUCTOR LASER DEVICE HAVING HIGH OPTICAL INTENSITY AND RELIABILITY

BACKGROUND OF THE INVENTION

1. Field of the Invention

The present invention relates to a semiconductor laser structure and, more particularly, to a high-output semiconductor laser demanded for reproduction.

2. Description of the Prior Art

A single-mode semiconductor laser which is free from astigmatism and has a lasing wavelength ranging from 780 to 830 nm is demanded for use as a light source for writing and reading data onto and from an optical disk. The self-aligned structure semiconductor laser is one of the most promising laser devices which can satisfy the above-described requirements. One type of conventional self-aligned structure semiconductor laser has been reported by S. Nakatsuka et al. (see Extended Abstracts of the 15th Conference on Solid State Device and Materials (1983) p. 297 to 300).

FIG. 2 shows the structure of a self-aligned structure semiconductor laser according to this prior art. In the production of a semiconductor laser having this structure, when a channel stripe is formed, the p-GaAlAs cladding layer 4 which defines the bottom of the channel is exposed to the atmosphere. Since the P-GaAlAs cladding layer 4 is oxidized considerably easily, at the same time as it is exposed to the atmosphere, the exposed surface 10 is oxidized. The oxide thus formed is undesirably left at the regrowth interface even after a crystal has been regrown on the exposed surface 10 of the p-GaAlAs cladding layer 4 and on the n-type GaAs blocking layer 5. Moreover, this oxide is present on the current path.

Thus, the above-described prior art suffers from the following problems. Namely, due to the oxide remaining at the regrowth interface, the electrical characteristics of the resultant laser device are considerably inferior, i.e., the threshold voltage of the current-voltage character of the device is 1.9 V, and the series resistance 5Ω. Accordingly, the yield of the device is undesirably low. In addition, the presence of the oxide at the regrowth interface causes the life of the device to be extremely shortened and prevents the device from being reliable.

SUMMARY OF THE INVENTION

It is a primary object of the present invention to provide a semiconductor laser which is free from lowering of the yield and reduction in the life and has high reliability by preventing the formation of the oxide at the regrowth interface. The present invention will be described hereinunder with reference to FIG. 1 which shows one form of the present invention.

The above-described object can be attained by setting the Al mole ratio of a semiconductor which constitutes a semiconductor layer that defines the bottom of a channel stripe and which is therefore exposed to the atmosphere when the stripe is formed, i.e., an interface layer 11 so that said Al mole ratio is smaller than that of a semiconductor constituting a cladding layer 4 and is smaller than or equal to the Al mole ratio of a semiconductor which constitutes an active layer, or by setting the Al mole ratio of the semiconductor constituting the interface layer 11 which is exposed to the atmosphere when a channel stripe is formed so that said Al mole ratio is smaller than that of the semiconductor constituting the cladding layer 4 and by setting the refractive index of a buried cladding layer 6 so as to be smaller than that of the cladding layer 4, or by setting the Al mole ratio of the interface layer 11 which is exposed to the atmosphere when a channel stripe is formed so that said Al mole ratio is smaller than that of the cladding layer 4 and larger than that of the active layer. In this case, since the semiconductor constituting the interface layer has a wider band gap than that of the active layer, there is no absorption loss caused by the interface layer.

DESCRIPTION OF THE PREFERRED EMBODIMENTS

If the Al mole ratio of a semiconductor which constitutes a semiconductor layer that defines the bottom of a channel strip and which is therefore exposed to the atmosphere when the channel stripe is formed, i.e., an interface layer, is set so as to be smaller than the Al mole ratio of a semiconductor constituting a cladding layer and also smaller than or equal to the Al mole ratio of a semiconductor which constitutes an active layer, then no oxide is formed on the surface exposed to the atmosphere during the formation of the channel stripe. This effect intensifies as the Al mole ratio becomes smaller in semiconductors having Al as a constituent atom. Accordingly, the above-described effect can be remarkably displayed by setting the Al mole ratio of a semiconductor which constitutes an interface layer so that said Al mole ratio is smaller than or equal to that of a semiconductor which constitutes an active layer. The above-described oxide results in adverse effects on the electrical and optical characteristics of a self-aligned structure semiconductor laser, deteriorates the yield and causes lowering of reliability. Accordingly, the prevention of formation of the oxide enables a semiconductor laser having high reliability to be obtained at high yield, advantageously.

Figure 4A:
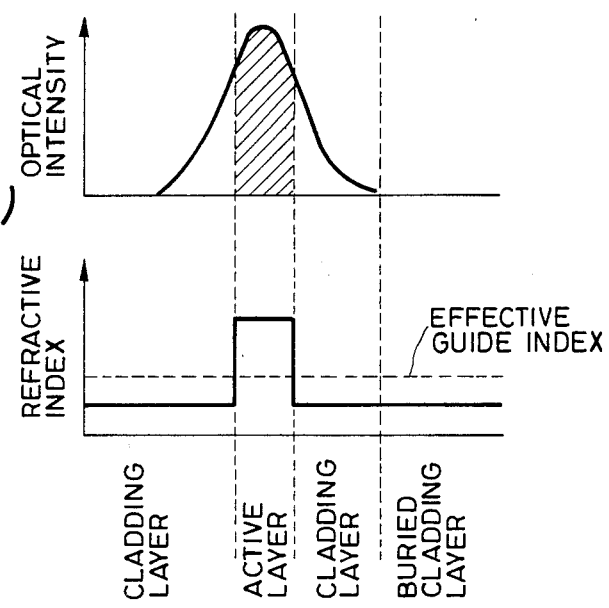
FIG. 4(a) shows an optical intensity distribution and refractive index distribution in relation to the prior art shown in FIG. 2 in the case where no interface layer is provided.
Figure 4B:
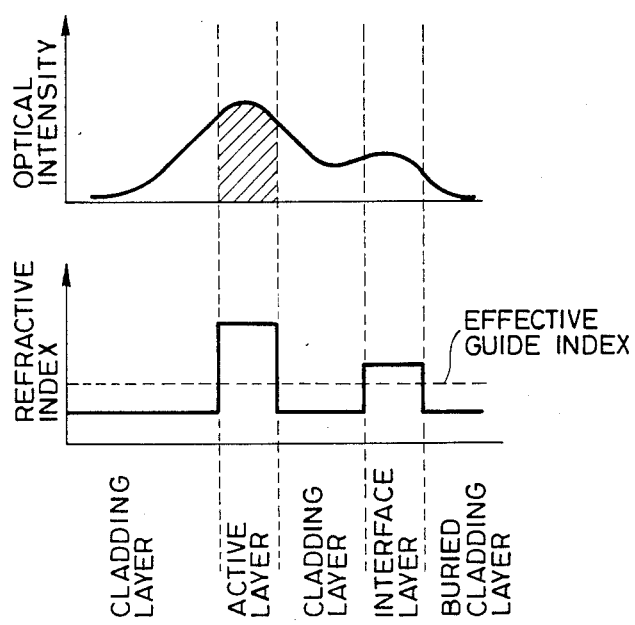
FIG. 4(b) shows an optical intensity distribution and refractive index distribution in relation to the semiconductor laser shown in FIG. 1 in the case where an interface layer is provided and the respective refractive indexes of the buried cladding layer and the cladding layer are made equal to each other.
Figure 4C:
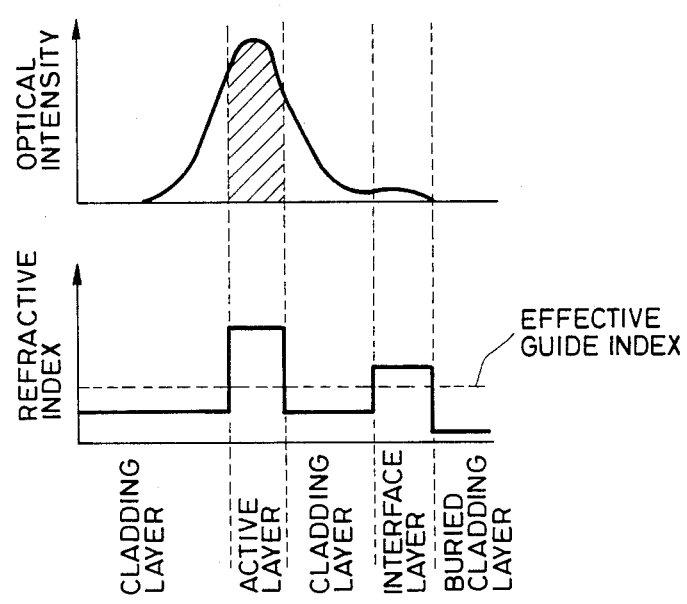
FIG. 4(c) shows an optical intensity distribution and refractive index distribution in relation to the semiconductor laser shown in FIG. 1 in the case where an interface layer is provided and the refractive index of the buried cladding layer is made smaller than that of the cladding layer.

Further, since the refractive index of the abovedescribed interface layer 11 is larger than the effective guide index (see the chain line in FIG. 4), light penetrates into the interface layer 11. FIG. 4(a) shows an optical intensity distribution in the case where the interface layer 11 is not provided, and FIG. 4(b) shows an optical intensity distribution in the case where the interface layer 11 is provided and the refractive index of the buried cladding layer 6 is made equal to that of the cladding layer 4. As will be clear from these figures, the provision of the interface layer 11 causes light to penetrate into the interface layer 11, resulting undesirably in a reduction in the ratio of the light intensity within the active layer to the sum of light intensity both within and outside the active layer (see the hatched portion in FIG. 4). This leads to a rise in the threshold current. However, it is possible to minimize the amount of light which penetrates into the interface layer by setting the refractive index of the buried cladding layer 6 so as to be smaller than that of the cladding layer 4. The optical intensity distribution in this case is shown in FIG. 4(c). As will be clear from this figure, when the refractive index of the buried cladding layer is relatively small, the amount of light which attenuates in this layer is large, so that light is distributed in such a manner as not to penetrate into this layer. Accordingly, the ratio of the light intensity within the interface layer to the sum of light intensity both within and output the interface layer also decreases because of the continuity of boundary condition, so that light is mainly guided through the active layer. In other words, the ratio of the light intensity within the active layer to the sum of light intensity both within and outside the active layer is substantially equal to that in the case where no interface layer is provided, and there is therefore no rise in the threshold current despite the provision of the interface layer.

Examples of the present invention will be described hereinunder with reference to the accompanying drawings.

EXAMPLE 1

Figure 1:
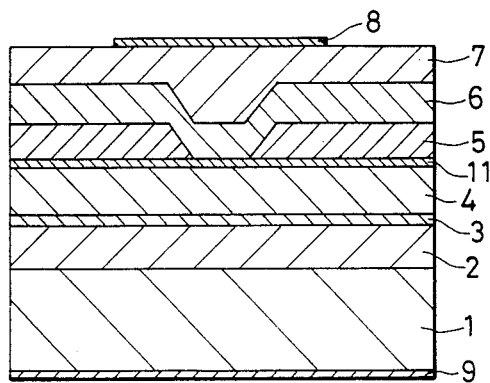
FIG. 1 is a view employed to describe Examples 1, 2 and 4.
Figure 2:
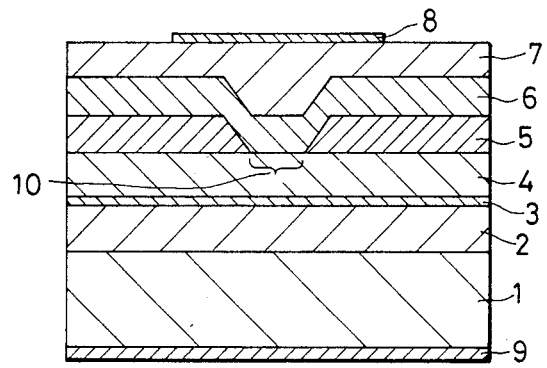
FIG. 2 shows a prior art.

Referring to FIG. 1, on an n-type GaAs substrate 1 are successively formed an n-type $Ga_{1-x}Al_xAs$ cladding layer 2 (x=0.45), a $Ga_{1-y}Al_yAs$ active layer 3 (y=0.14), a p-type $Ga_{1-x}Al_xAs$ cladding layer 4 (x=0.45), a p-type $Ga_{1-z}Al_zAs$ interface layer 11 (z=0.25) and an n-type GaAs blocking layer 5 by the MOCVD (Metal-Organic Chemical Vapor Deposition) technique. The n-type GaAs blocking layer 5 is completely removed by photolithographic and etching techniques to form a channel stripe having a width of 1 to 15 μm which exposes the surface of the p-type $Ga_{1-z}Al_zAs$ interface layer 11. Then, a p-type $Ga_{1-x}Al_xAs$ buried cladding layer 6 (x=0.45) and a p-type GaAs cap layer 7 are formed by the MOCVD technique. Thereafter, a p-type electrode 8 and an n-type electrode 9 are formed, and the wafer is then cleaved to obtain a laser device having a cavity length of about 300 μm.

The device thus produced on a trial basis performed under continuous wave operation at room temperature at a lasing wavelength of 780 nm and a threshold current of 30 to 50 mA. The emission spectrum was a stable signal mode. There was no astigmatism. Further, the electrical characteristics of the laser device were found to be excellent, i.e., the threshold voltage in the current-voltage character was 1.3 V and the series resistance 1.5Ω. In addition, no noticeable deterioration in the life of the device in 40 mW APC (Auto Power Control) at 70° C. was found even after 2000 hours had elapsed after the start of the test. Thus, it has been confirmed that the device has high reliability.

Although in this example the device was prepared by the MOCVD technique, similar characteristics were obtained in regard to a device prepared by the MBE (Molecular Beam Epitacy) technique.

EXAMPLE 2

Referring to FIG. 1, on an n-type GaAs substrate 1 are successively formed an n-type $Ga_{1-x}Al_xAs$ cladding layer 2 (x=0.45), a $Ga_{1-y}Al_yAs$ active layer 3 (y=0.14), a p-type $Ga_{1-x}Al_xAs$ cladding layer 4 (x=0.45), a p-type GaAs interface layer 11 and an n-type GaAs blocking layer 5. A photomask having a window width of 1 to 15 μm is formed on this wafer by a photolithographic technique, and with this mask used, the n-type GaAs blocking layer 5 is completely removed with a phosphoric acid etchants to form a channel stripe having a width of 1 to 15 μm which exposes the surface of the p-type GaAs interface layer 11. Then, a p-type $Ga_{1-x}Al_xAs$ buried cladding layer 6 (x=0.45) and a p-type GaAs cap layer 7 are formed by the MOCVD technique. Thereafter, a p-type electrode 8 and an n-type electrode 9 are formed, and the wafer is then cleaved to obtain a laser device having a cavity length of about 300 μm.

The device thus produced on a trial basis performed under continuous wave operation at room temperature at a lasing wavelength of 780 nm and a threshold current of 30 to 50 mA. The emission spectrum was a stable single mode. There was no astigmatism. Further, the electrical characteristics of the laser device were found to be excellent, i.e., the threshold voltage in the current-voltage character was 1.35 V and the series resistance 1.5Ω. In addition, no noticeable deterioration in the life of the device in 40 mW APC (Auto Power Control) at 70° C. was found even after 2000 hours had elapsed after the start of the test. Thus, it has been confirmed that the device has high reliability.

EXAMPLE 3

Figure 3:
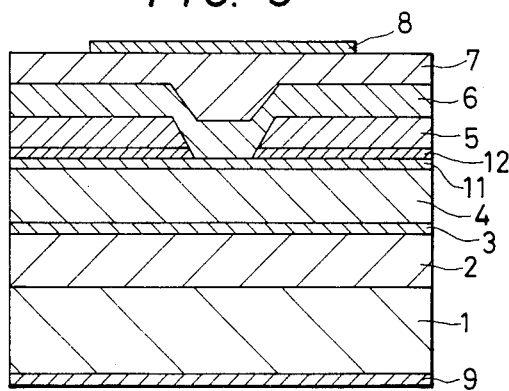
FIG. 3 is a view employed to describe Example 3.

Referring to FIG. 3, on an n-type GaAs substrate 1 are successively formed an n-type $Ga_{1-x}Al_xAs$ cladding layer 2 (x=0.35), a GaAs active layer 3, a p-type $Ga_{1-x}Al_xAs$ cladding layer 4 (x=0.35), a p-type GaAs interface layer 11, an n-type $Ga_{1-u}Al_uAs$ etching stop layer 12 (u=0.35) and an n-type GaAs blocking layer 5. A photomask having a window width of 1 to 15 μm is formed on this wafer by a photolithographic technique, and with this mask used, the n-type GaAs blocking layer 5 is selectively removed by RIE (Reactive Ion Etching). At this time, since the etching rate of the n-type GaAs blocking layer 5 is about 200 times as large as that of the n-type $Ga_{1-u}Al_uAs$ etching stop layer 12, the etching stops at the surface of the n-type $Ga_{1-u}Al_uAs$ etching stop layer 12. Thereafter, the n-type $Ga_{1-u}Al_uAs$ etching stop layer 12 is removed by wet etching, and a channel stripe having a width of 1 to 15 μm which exposes the surface of the p-type interface layer 11 is formed. The presence of the n-type $Ga_{1-u}Al_uAs$ etching stop layer 12 enables the etching by RIE to be reliably stopped at the surface of this layer and there is therefore no fear of the p-type GaAs interface layer 11 being over-etched. Then, a p-type $Ga_{1-x}Al_xAs$ buried cladding layer 6 (x=0.35) and a p-type GaAs cap layer 7 are formed by the MBE technique. Thereafter, a p-type electrode 8 and an n-type electrode 9 are formed, and the wafer is then cleaved to obtain a laser device having a cavity length of about 300 μm.

The device thus produced on a trial basis performed under continuous wave operation at room temperature at a lasing wavelength of 890 nm and a threshold current of 30 to 50 mA. The emission spectrum was a stable single mode. There was no astigmatism. Further, the electrical characteristics of the laser device were found to be excellent, i.e., the threshold voltage in the current-voltage character was 1.35 V and the series resistance 1.35Ω. In addition, no noticeable deterioration in the life of the device in 40 mW APC (Auto Power Control) at 70° C. was found even after 2000 hours had elapsed after the start of the test. Thus, it has been confirmed that the device has high reliability.

EXAMPLE 4

Referring to FIG. 1, on an n-type GaAs substrate 1 are successively formed an n-type $Ga_{1-x}Al_xAs$ cladding layer 2 (x=0.38), a $Ga_{1-y}Al_yAs$ active layer 3 (y=0.06), a p-type $Ga_{1-x}Al_xAs$ cladding layer 4 (x=0.38), a p-type $Ga_{1-z}Al_zAs$ interface layer 11 (z=0.20) and an n-type GaAs blocking layer 5 by the MOCVD technique. The n-type GaAs blocking layer 5 is completely removed by photolithographic and etching techniques to form a channel stripe having a width of 1 to 15 μm which exposes the surface of the p-type $Ga_{1-z}Al_zAs$ interface layer 11. Then, a p-type $Ga_{1-u}Al_uAs$ buried cladding layer 6 (u=0.50) and a p-type GaAs cap layer 7 are formed by the MOCVD technique. Thereafter, a p-type electrode 8 and an n-type electrode 9 are formed, and the wafer is then cleaved to obtain a laser device having a cavity length of about 300 μm.

The device thus produced on a trial basis had an optical intensity distribution such as that shown in FIG. 4(c) and performed under continuous wave operation at room temperature at a lasing wavelength of 830 nm and a threshold current of 30 to 50 mA. The emission spectrum was stable single mode. There was no astigmatism. Further, the electrical characteristics of the laser device were found to be excellent, i.e., the threshold voltage in the current-voltage character was 1.3 V and the series resistance 1.5Ω. In addition, no noticeable deterioration in the life of the device in 40 mW APC (Auto Power Control) at 70° C. was found even after 2000 hours had elapsed after the start of the test. Thus, it has been confirmed that the device has high reliability.

It should be noted that the present invention is not necessarily limited to semiconductor lasers having lasing wavelengths of about 780 nm, 830 nm and 890 nm, but similar favorable results were obtained for GaAlAs semiconductor lasers having a lasing wavelength ranging over the entire range from 680 to 890 nm within which they can operate at room temperature continuously. Although in the above Examples a single GaAlAs layer was employed as an active layer, similar results were obtained in the case in which the active layer consists of an MQW (Multi-Quantumn Well), i.e., a super lattice of $Ga_{1-v}Al_vAs$ and $Ga_{1-w}Al_wAs$ (v÷w). Further, the laser structure is not necessarily limited to those which are based on the three-layer slab waveguide shown in the above-described Examples, and it has been confirmed that the present invention can also be applied to the LOC (Large Optical Cavity) structure in which an optical guide layer is provided at one side of the active layer and the GRIN-SCH (Graded-Index-Separate-Confinement-Heterostructure) in which an optical guide layer is provided adjacent to each side of the active layer.

Similar results were also obtained in the case of a laser structure in which all the conductivity types in the above-described Examples were reversed (i.e., p and n were replaced with n and p, respectively).

Although in the described Examples GaAlAs materials were employed, it is, as a matter of course, possible to apply the present invention to all materials including Al, for example, AlGaPAs, AlInPAs, AlGaInP and AlGaInAs.

It should be noted that the present invention can be carried out even in the case where an inclusion lies between the substrate and the semiconductor region which is adjacent thereto and/or between each pair of adjacent semiconductor regions.

Thus, it is possible to prevent the formation of an oxide on the semiconductor surface which is exposed to the atmosphere when a channel stripe is formed by setting the Al mole ratio of a semiconductor which constitutes the semiconductor layer that defines the bottom of the channel stripe and which is therefore exposed to the atmosphere when the channel stripe is formed so that said Al mole ratio is smaller than that of a semiconductor which constitutes a cladding layer. Further, by setting the refractive index of a buried cladding layer so as to be smaller than that of a cladding layer which is adjacent to the interface layer, light is prevented from penetrating into the interface layer and therefore the ratio of the light intensity within the active layer to the sum of light intensity both within and outside the active layer is substantially equal to that in the case where no interface layer is provided. As a result, the threshold voltage of the diode character which has heretofore been 1.9 V in the conventional laser structure is improved to 1.35 V by virtue of the laser structure according to the present invention. The series resistance which has heretofore been 5Ω in the conventional laser structure is also improved to 1.5Ω by the laser structure according to the present invention. These facts show that the crystallizability of the crystal in the vicinity of the interface has been improved by a large margin. As to the reliability also, the laser structure according to the present invention provides a great improvement. More specifically, although in the conventional laser structure the life of the device in 40 mW APC (Auto Power Control) at 70° C. has been from 20 to 30 hours, in the laser structure of the present invention no noticeable deterioration in the life was found even after 2000 hours had elapsed after the start of the test.

What is claimed is:
1. A semiconductor laser device structure comprising:
- a semiconductor region of first conductivity type;
- a first cladding layer of said first conductivity type formed on said semiconductor region;
- an active layer formed on said first cladding layer, said active layer having a larger refractive index than that of said first cladding layer and a smaller band gap than that of said first cladding layer;
- a second cladding layer of a second conductivity type, different from said first conductivity type, formed on said active layer, said second cladding layer containing Al as a constituent atom, and having a smaller refractive index than that of said active layer and a larger band gap than that of said active layer;
- an interface layer of said second conductivity type formed on said second cladding layer, said interface layer containing Al as a constituent atom;
- a semiconductor layer formed on said interface layer, said semiconductor layer having a stripe shaped channel extending through said semiconductor layers so as to expose said interface layer and lying from one side to another side of a laser resonator in the direction of a laser beam;

a buried cladding layer of said second conductivity type buried at least in said stripe shaped channel, wherein said interface layer has a smaller Al mole ratio than that of said second cladding layer, and said buried cladding layer has a smaller refractive index than that of said second cladding layer; and a pair of electrodes one of which is electrically coupled to said first cladding layer and the other to said buried cladding layer.

2. A semiconductor laser device structure according to claim 1, wherein said interface layer has an Al mole ratio equal to or greater than that of said active layer.

3. A semiconductor laser device structure according to claim 1, wherein said semiconductor layer includes at least a function as a current blocking layer.

4. A semiconductor laser device structure according to claim 3, wherein said semiconductor region comprises a first conductivity type GaAs substrate region contiguous on one surface to said first cladding layer, said buried cladding layer being formed on said semiconductor layer and having a portion buried in said stripe shaped channel; and wherein said device further including a GaAs cap layer formed on said buried cladding layer, a first electrode being formed on said cap layer and a second electrode formed on a second surface of said substrate region.

5. A semiconductor laser device structure according to claim 4, having a laser device cavity length of about 300 $\mu$m.

6. A semiconductor laser device structure according to claim 4, wherein said stripe shaped channel of said semiconductor layer having a width of 1 to 15 $\mu$m and wherein such width corresponding to the amount of surface exposure of said interface layer.

7. A semiconductor laser device structure according to claim 6, wherein said first cladding layer is comprised of first conductivity type $Ga_{1-x}Al_xAs$, said active layer is comprised of $Ga_{1-y}Al_yAs$, said second cladding layer is comprised of second conductivity type $Ga_{1-x}Al_xAs$, said interface layer is comprised of second conductivity type $Ga_{1-z}Al_zAs$, said semiconductor layer is comprised of first conductivity type GaAs, said buried cladding layer is comprised of second conductivity type $Ga_{1-u}Al_uAs$ and said cap layer is comprised of second conductivity type GaAs, where x, y, u and z have values of about 0.38, 0.06, 0.50 and 0.20, respectively.

8. A semiconductor laser device structure according to claim 2, wherein said first and second conductivity type are n-type and p-type, respectively.

9. A semiconductor laser device structure according to claim 7, wherein said first and second conductivity type are p-type and n-type, respectively.

* * * * *